US009766554B2

(12) United States Patent
Chen et al.

(10) Patent No.: US 9,766,554 B2
(45) Date of Patent: Sep. 19, 2017

(54) METHOD AND APPARATUS FOR ESTIMATING FOCUS AND DOSE OF AN EXPOSURE PROCESS

(71) Applicant: TAIWAN SEMICONDUCTOR MANUFACTURING COMPANY, LTD., Hsin-Chu (TW)

(72) Inventors: Yen-Liang Chen, Zhubei (TW); Chih-Ming Ke, Hsinchu (TW); Kai-Hsiung Chen, New Taipei (TW); Wen-Zhan Zhou, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 69 days.

(21) Appl. No.: 14/717,128

(22) Filed: May 20, 2015

(65) Prior Publication Data

US 2016/0274456 A1    Sep. 22, 2016

Related U.S. Application Data

(60) Provisional application No. 62/133,720, filed on Mar. 16, 2015.

(51) Int. Cl.
*G03F 7/20* (2006.01)
*G03F 9/00* (2006.01)

(52) U.S. Cl.
CPC ...... *G03F 7/70683* (2013.01); *G03F 7/70483* (2013.01); *G03F 7/70558* (2013.01); *G03F 7/70625* (2013.01); *G03F 7/70641* (2013.01); *G03F 9/7026* (2013.01)

(58) Field of Classification Search
CPC ............... G03F 7/70683; G03F 9/7026; G03F 7/70483; G03F 7/7055; G03F 7/70558; G03F 7/70641
See application file for complete search history.

(56) References Cited

U.S. PATENT DOCUMENTS

| | | | |
|---|---|---|---|
| 8,716,841 B1 | 5/2014 | Chang et al. | |
| 8,736,084 B2 | 5/2014 | Cheng et al. | |
| 8,837,810 B2 | 9/2014 | Chen et al. | |
| 2009/0201505 A1 | 8/2009 | Markoya | |

(Continued)

FOREIGN PATENT DOCUMENTS

| | | |
|---|---|---|
| CN | 1590957 A | 3/2005 |
| CN | 102272678 A | 12/2011 |

(Continued)

*Primary Examiner* — Michelle M Iacoletti
(74) *Attorney, Agent, or Firm* — Haynes and Boone, LLP

(57) ABSTRACT

A structure in semiconductor fabrication includes at least a first periodic asymmetric feature and a periodic asymmetric second feature. The first feature contains a plurality of periodically distributed first elements. The first feature has a first asymmetric profile such that the first feature no longer has the same first asymmetric profile when it is rotated by 180 degrees. The second feature contains a plurality of periodically distributed second elements. The second feature has a second asymmetric profile such that the second feature no longer has the same second asymmetric profile when it is rotated by 180 degrees. The second asymmetric profile is different from the first asymmetric profile.

20 Claims, 8 Drawing Sheets

(56) References Cited

U.S. PATENT DOCUMENTS

| | | |
|---|---|---|
| 2011/0249247 A1* | 10/2011 | Cramer ................... G03F 1/14 355/55 |
| 2012/0044472 A1 | 2/2012 | Den Boef et al. |
| 2012/0308112 A1 | 12/2012 | Hu et al. |
| 2013/0201461 A1 | 8/2013 | Huang et al. |
| 2014/0101624 A1 | 4/2014 | Wu et al. |
| 2014/0111779 A1 | 4/2014 | Chen et al. |
| 2014/0119638 A1 | 5/2014 | Chang et al. |
| 2014/0123084 A1 | 5/2014 | Tang et al. |
| 2014/0226893 A1 | 8/2014 | Lo et al. |
| 2014/0253901 A1 | 9/2014 | Zhou et al. |
| 2014/0256067 A1 | 9/2014 | Cheng et al. |
| 2014/0257761 A1 | 9/2014 | Zhou et al. |
| 2015/0338749 A1* | 11/2015 | Hinnen ................... G03F 1/44 355/55 |

FOREIGN PATENT DOCUMENTS

| | | |
|---|---|---|
| CN | 102498441 A | 6/2012 |
| CN | 104395830 A | 3/2015 |
| WO | WO 2009130010 A1 | 10/2009 |

\* cited by examiner

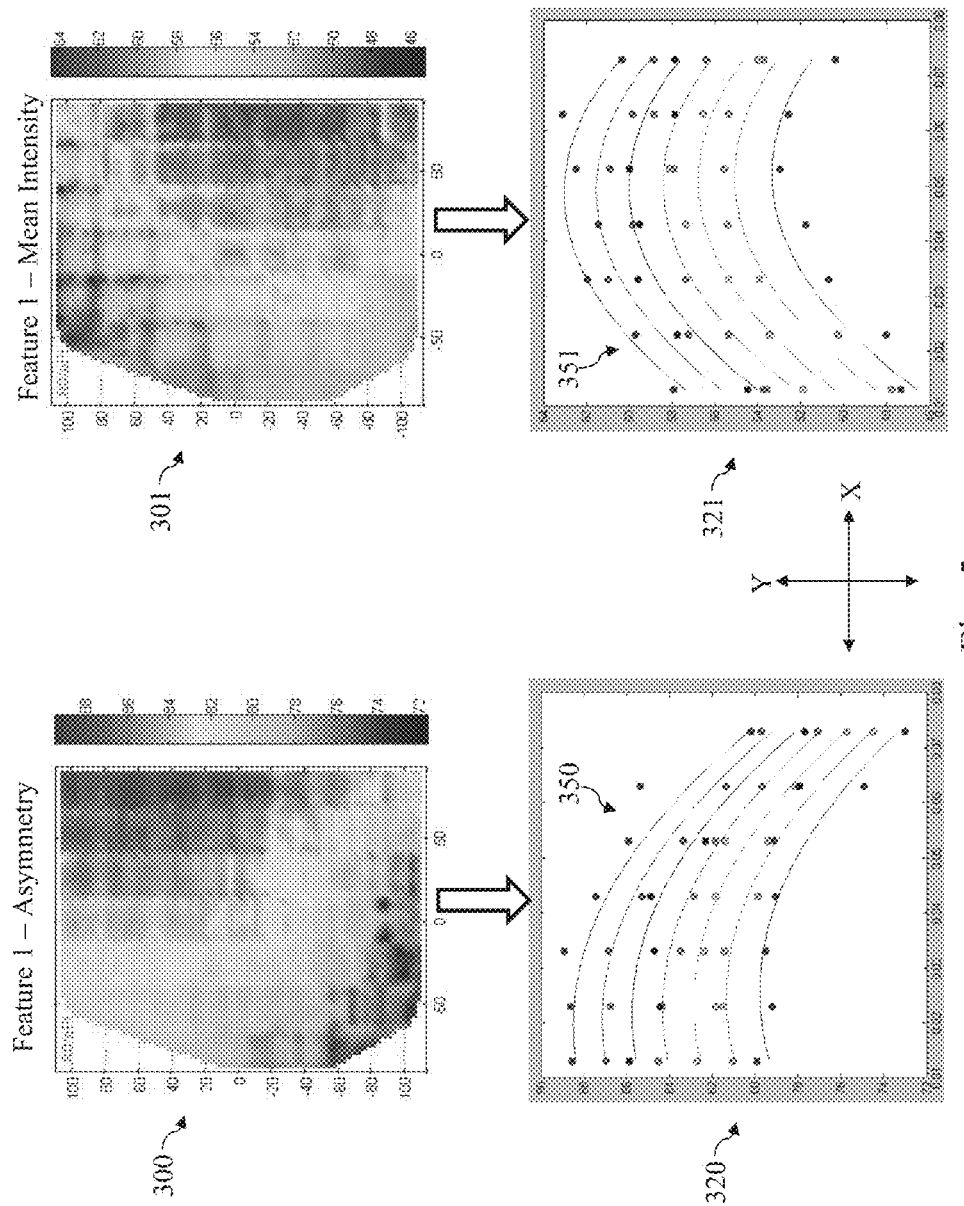

METHOD AND APPARATUS FOR ESTIMATING FOCUS AND DOSE OF AN EXPOSURE PROCESS

PRIORITY DATA

The present application is a utility patent application of U.S. Provisional patent application No. 62/133,720, filed on Mar. 16, 2015, and entitled "METHOD AND APPARATUS FOR ESTIMATING FOCUS AND DOSE OF AN EXPOSURE PROCESS", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, it may be desirable to determine the focus and/or dose of a lithography apparatus used in a lithographic process. For example, the focus and dose associated with an exposure process may affect the shape and/or size of photoresist patterns formed on a substrate. Unfortunately, existing methods and apparatuses typically cannot provide an accurate estimation of both the actual focus and dose of an exposure process.

Therefore, while existing methods of determining dose and/or focus of an exposure process have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5-6 are images and graphs that visually illustrate, on a portion of a wafer, the asymmetry data and mean intensity data measured by an optical measurement tool for a first periodic asymmetric feature and a second periodic asymmetric feature, respectively, in accordance with some embodiments of the present disclosure.

DETAILED DESCRIPTION

Figure 1:
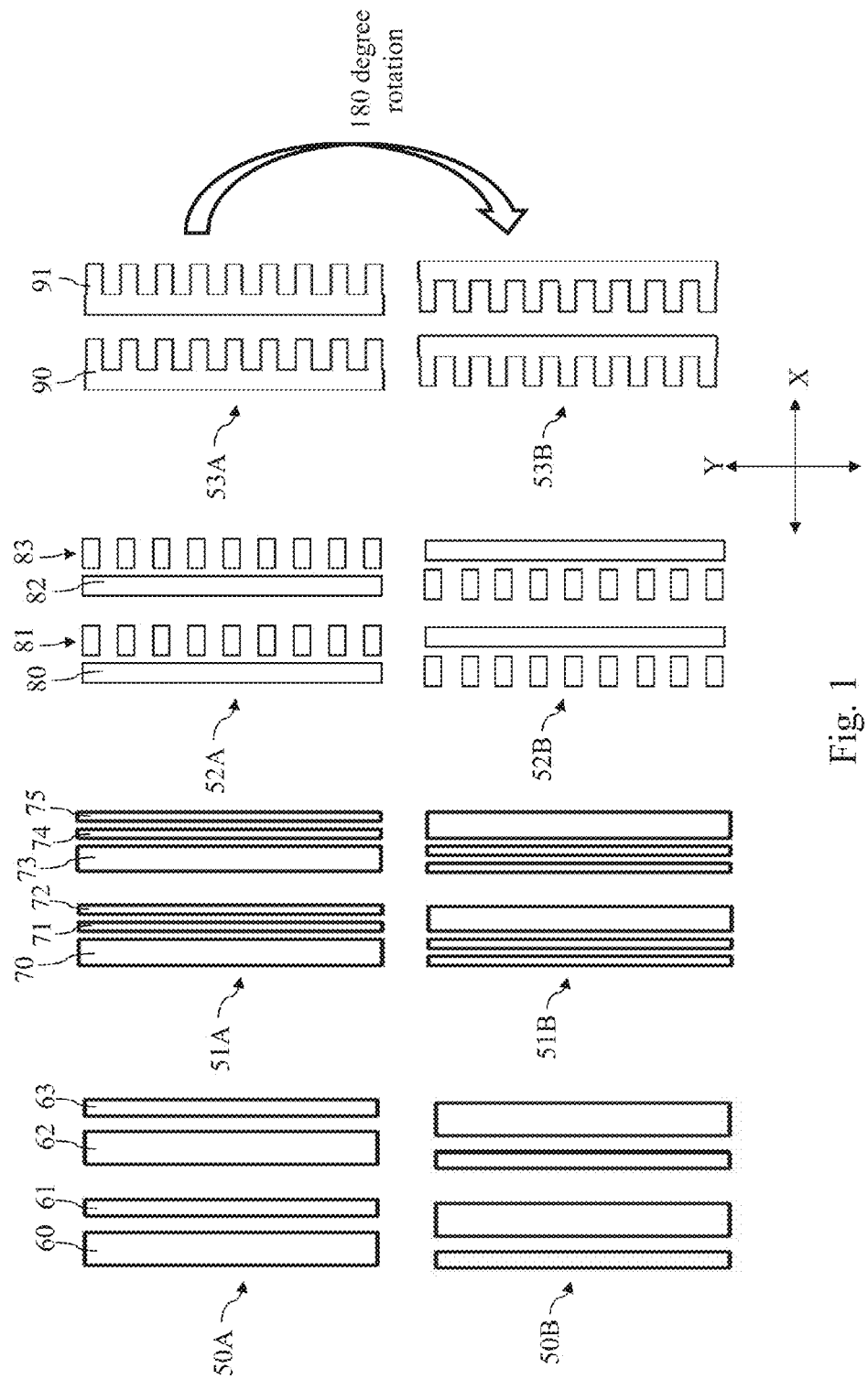
FIG. 1 is a diagrammatic top view of a plurality of example periodic asymmetric features in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Exposure of a photoresist material is a part of a lithography process used to fabricate semiconductor devices. The variations in focus and/or dose of the exposure process can affect the photoresist patterns formed as a result of the lithography process. As semiconductor device sizes continue to shrink, even small variations in the photoresist patterns may have a detrimental effect on the final semiconductor device. Therefore, it may be desirable to determine the focus and dose information associated with an exposure process, so that unintended deviations of the focus and dose of the exposure process may be detected and corrected.

Unfortunately, existing methods and apparatuses have not been able to provide a reliable way to determine both the focus and dose of an exposure process. Some existing methods may be able to provide a crude estimate of the focus of an exposure process, but the crosstalk from dose could not be fully eliminated. As a result, the focus estimation accuracy is not high. These traditional methods may also have stringent fabrication requirements (e.g., they may require sub-resolution features).

To overcome these drawbacks associated with existing methods used to determine focus and dose of an exposure process, the present disclosure provides novel methods and apparatuses for determining focus and dose. In some embodiments, the present disclosure establishes a mathematical model by using a structure that contains two or more periodic asymmetric features. The model describes a relationship between asymmetry and mean intensity of the asymmetric features and the focus and dose used to form the asymmetric features. Using this model, focus and dose data of an exposure process can be estimated by measuring the asymmetry and mean intensity data of asymmetric features on a production wafer. The various aspects of the present disclosure will be discussed below in greater detail with reference to FIGS. 1-8.

FIG. 1 illustrates diagrammatic top views of several example periodic asymmetric features 50A-53A according to embodiments of the present disclosure. The features 50A-53A are asymmetric such that if they are rotated by 180 degrees, the resulting rotated features 50B-53B will look substantially different. For example, the rotated feature 50B looks substantially different from the feature 50A, the rotated feature 51B looks substantially different from the feature 51A, the rotated feature 52B looks substantially different from the feature 52A, and the rotated feature 53B looks substantially different from the feature 53A. An alternative way of describing the asymmetry of the features 50A-53A is that the feature profile (e.g., the geometries and shapes of its components) of each feature is not the same as its reverse profile from the left side to the right side (e.g., flipped across the X-axis).

Each of the asymmetric features 50A-53A contains a plurality of sub-features or elements, respectively. For example, the feature 50A contains elements 60-63, the feature 51A contains elements 70-75, the feature 52A contains elements 80-83, and the feature 53A contains elements 90-91. In each of the features 50A-53A, the respective elements have a periodic distribution (e.g., distributed across regular distance intervals). For example, the elements 60 and 61 substantially resemble the elements 62 and 63, respectively. The distance (measured along the X-axis) separating the elements 60 and 62 is also substantially the same as the distance separating the elements 61 and 63. In other words, the elements 62-63 may be viewed as copies of the elements 60-61 located at a predefined distance away from the elements 60-61. As such, the elements 60-63 of the feature 50A are distributed across regular intervals (i.e., the interval being a distance between the elements 60 and 62, or the distance between the elements 61 and 63) along the X-axis.

Similarly, the feature 51A includes elements 70-75. The elements 70-75 are shaped as elongate rectangles, though the elements 70 and 73 have wider lateral dimensions (measured along the X-axis) than the elements 71-72 and 74-75. The elements 73-75 may be viewed as copies of the elements 70-72 located at a predefined distance away from the elements 70-72. As such, it may be said that the elements 70-75 of the feature 51A are distributed across regular intervals (i.e., the interval being a distance between the elements 70 and 73) along the X-axis.

Feature 52A contains elongate elements 80 and 82, and a plurality of smaller elements 81 and 83 distributed adjacent to the elongate elements 80 and 82, respectively. The elements 82-83 may be viewed as copies of the elements 80-81 located at a predefined distance away from the elements 80-81. Feature 53A contains irregularly shaped elements 90 and 91, which substantially resemble one another in shape and geometry. Thus, the element 91 may be viewed as a copy of the element 90 located at a predefined distance away from the element 90.

In each of the features 50A-53A illustrated in FIG. 1, the periodic distribution of their respective elements are along (or with respect to) the X-axis for illustrative purposes. However, the periodic distribution of the elements of the features 50A-53A may be along another axis different from the X-axis, for example along a Y-axis that is perpendicular to the X-axis or even along another axis that is not parallel to either the X-axis or the Y-axis. For reasons of simplicity, this is not specifically illustrated in FIG. 1.

Regardless of how the elements of the features 50A-53A are periodically distributed, each of these periodic asymmetric features 50A-53A would cause different diffraction intensity when light is projected from different (or opposing) sides. When focus or dose changes in the exposure process, the asymmetric profile of the features 50A-53A would also change, which can be measured from the diffraction intensity. This will be discussed in greater detail below with reference to FIGS. 4A-4B and 5-7. It is also understood that in some embodiments, none of the features 50A-53A contain sub-resolution features (or sub-resolution assist features). Stated differently, the elements 60-63, 70-75, 80-83, and 90-91 are not sub-resolution features.

Figure 2:
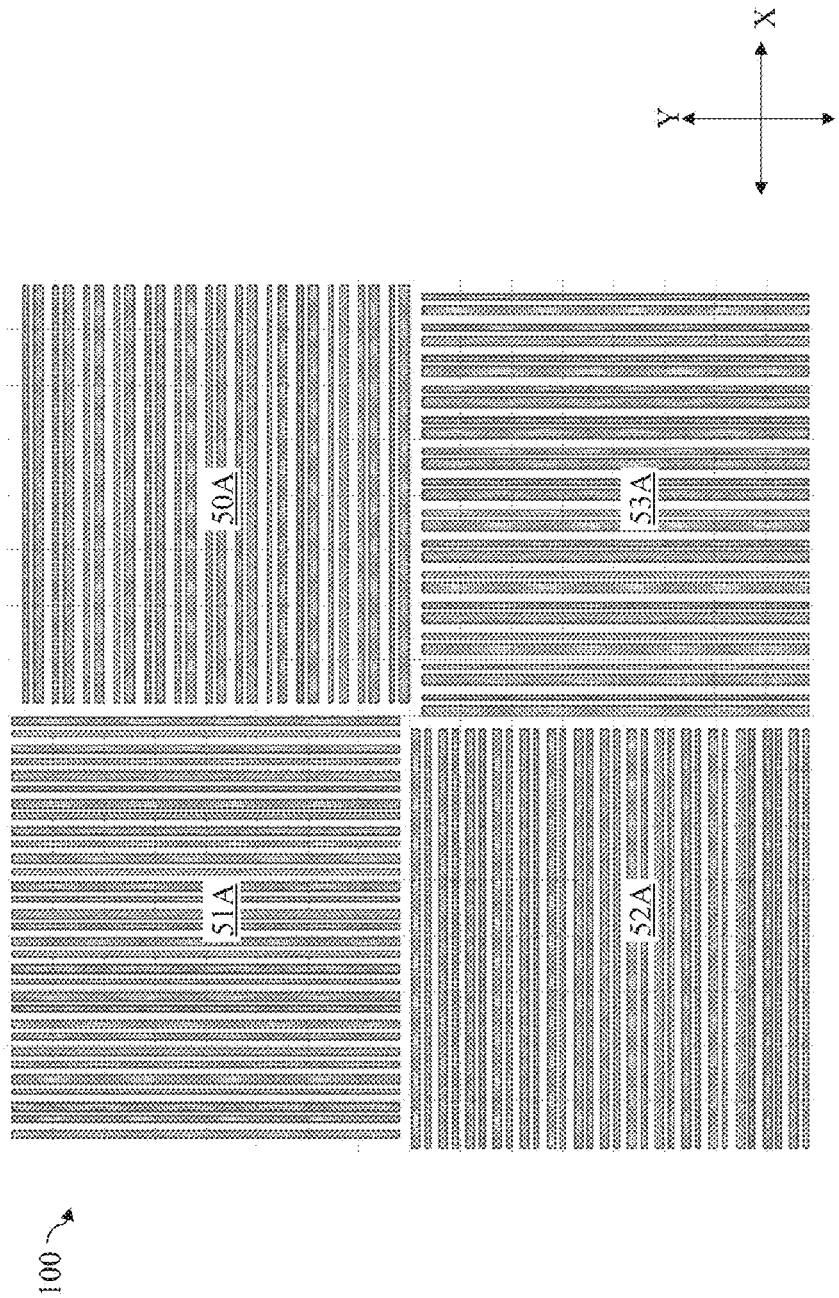
FIGS. 2-3 are diagrammatic top view of a structure that contains at least two of the periodic asymmetric features in accordance with some embodiments of the present disclosure.

FIG. 2 is a diagrammatic top view of a structure 100 that contains a plurality (e.g., at least two) of periodic asymmetric features according to an embodiment. For example, the structure 100 shown in FIG. 2 contains four asymmetric features 50A, 51A, 52A, and 53A. In FIG. 2, the asymmetric feature 50A is located at a "top right" corner of the structure 100, the asymmetric feature 51A is located at a "top left" corner of the structure 100, the asymmetric feature 52A is located at a "bottom left" corner of the structure 100, and the asymmetric feature 53A is located at a "bottom right" corner of the structure 100.

It is understood that in the structure 100, the features 50A-53A may also be rotated. For example, the features 50A and 52A are rotated by 90 degrees (compared to their orientation as shown in FIG. 1) in the structure 100. Stated differently, the elements in the features 50A and 52A within the structure 100 are distributed periodically along the Y-axis, while the elements in the features 51A and 53A within the structure 100 are distributed periodically along the X-axis.

Figure 3:
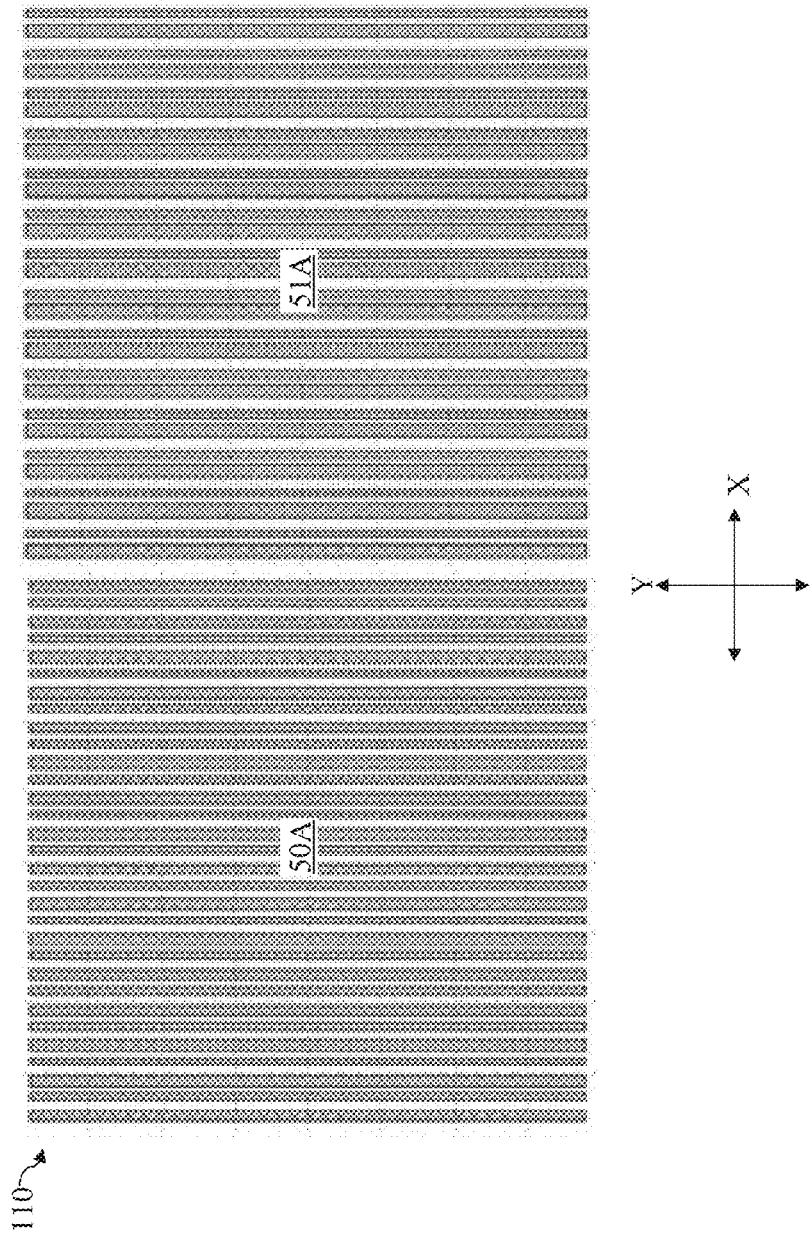

FIG. 3 is a diagrammatic top view of a structure 110 that contains a plurality (e.g., at least two) of periodic asymmetric features according to an embodiment. The structure 110 shown in FIG. 3 contains two features 50A and 51A, rather than four features 50A-53A as in the structure 100. Both the features 50A-51A in the structure 110 have elements that are distributed periodically along the X-axis, but it is understood that either one (or both) of the features 50A-51A may be rotated by 90 degrees such that their elements are distributed periodically along the Y-axis in alternative embodiments.

It is understood that the structures 100 and 110 shown in FIGS. 2-3 are mere example structures that contain two or more periodic asymmetric features. In other embodiments, the structure may include a different number of periodic asymmetric features (as long as it is at least two), and the asymmetric features may have different designs than the example features 50A-53A and/or may be rotated differently than the orientation shown in FIG. 1.

Figures 4A, 4B:
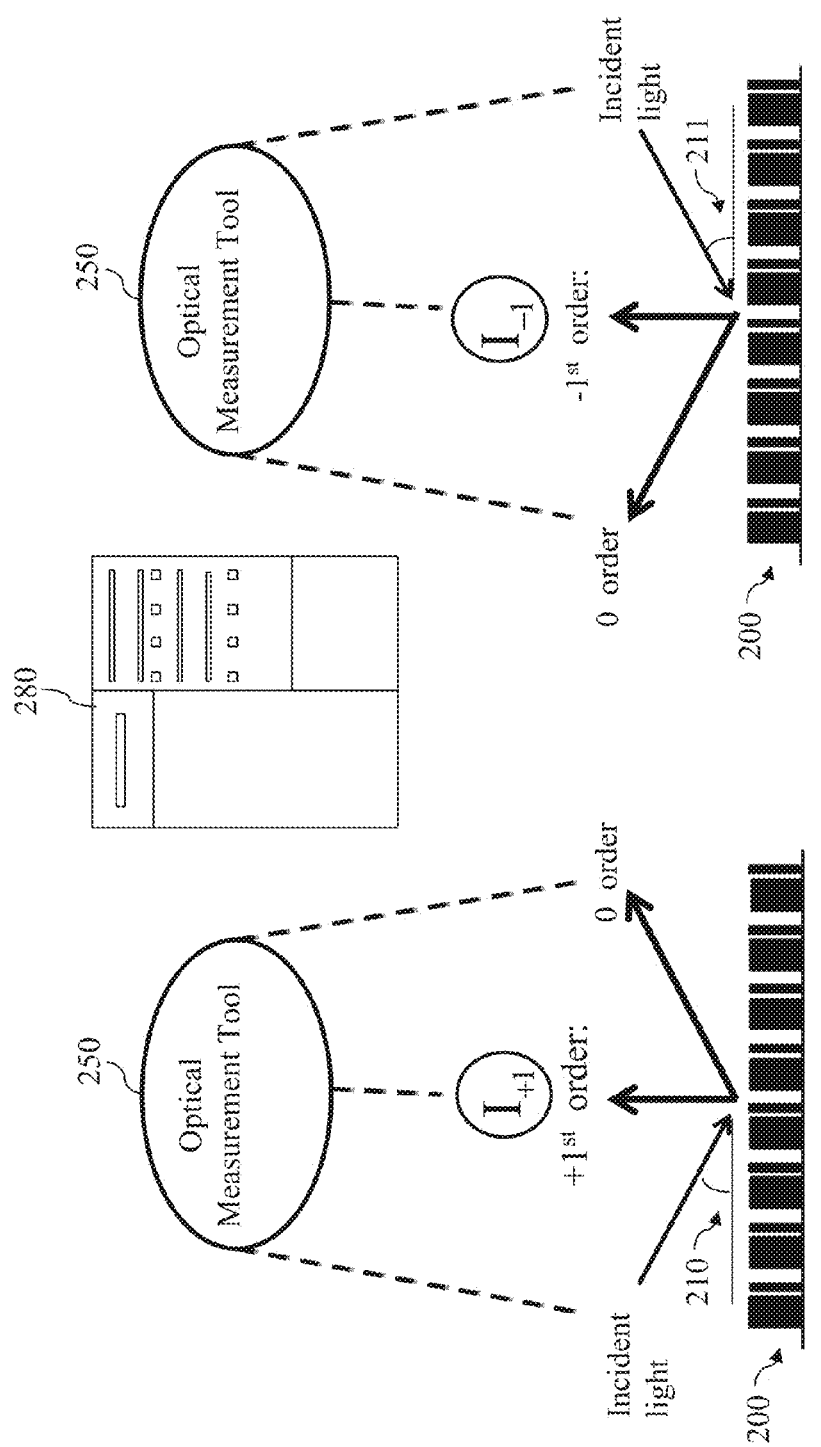
FIGS. 4A-4B are simplified diagrammatic views of a system that is configured to extract information pertaining to asymmetry and mean intensity of diffraction light from a structure similar to the structure of FIGS. 2-3 in accordance with some embodiments of the present disclosure.

FIGS. 4A-4B are diagrammatic illustrations of systems for measuring asymmetry and mean intensity information from a structure containing multiple period asymmetric features according to an embodiment of the present disclosure. In both FIGS. 4A-4B, a cross-sectional view of a structure 200 containing multiple (e.g., at least two) period asymmetric features is shown. The structure 200 may be an embodiment of the structure 100 of FIG. 2, or may be an embodiment of the structure 110 of FIG. 3, or may include another suitable arrangement of multiple periodic asymmetric features. In the embodiment illustrated, the structure 200 is a photoresist structure, meaning that a photoresist material has been patterned (in part by an exposure process) to form the structure 200 on the wafer.

In FIG. 4A, an incident light is projected toward the structure 200 from its "left" side. The incident light is projected toward the structure 200 at an angle 210 (measured between the incident light and a horizontal plane on which the structure 200 is disposed). The angle 210 is greater than 0 degrees but less than 90 degrees, for example between 5 degrees and 85 degrees in some embodiments. In response to the incident light, at least a 0 order of diffraction light and a +1 order of diffraction light will be produced, as shown in FIG. 4A. The +$1^{st}$ order of diffraction light may be denoted by $I_{+1}$ hereinafter. The 0 order of diffraction light and the +1 order of diffraction light may be measured or detected by an optical measurement tool 250. In some embodiments, the optical measurement tool 250 includes a scatterometry machine. In some other embodiments, the optical measurement tool 250 includes a diffractometry machine. It is understood that the optical measurement tool 250 may also be configured to provide the incident light in some embodiments.

In FIG. 4B, an incident light is projected toward the structure 200 from its "right" side. In the embodiment illustrated herein, the left and right sides of the structure 200 are defined with respect to the asymmetry of the features within. For example, if the features within the structure 200 are asymmetrical from a first side to a second side opposite the first side, then the first side may be the left side, and the second side may be the right side herein. Similar to the case in FIG. 4A, the incident light in FIG. 4B is also projected toward the structure 200 at an angle 211 (measured between the incident light and a horizontal plane on which the structure 200 is disposed). The angle 210 is greater than 0 degrees but less than 90 degrees, for example between 5 degrees and 85 degrees in some embodiments. In some embodiments, the angle 210 and the angle 211 are equal to each other. In response to the incident light, at least a 0 order of diffraction light and a −1 order of diffraction light will be produced, as shown in FIG. 4B. The −$1^{st}$ order of diffraction light may be denoted by $I_{-1}$ hereinafter. The 0 order of diffraction light and the −1 order of diffraction light may be measured or detected by the optical measurement tool 250 again, which as discussed above may include a scatterometry machine or a diffractometry machine.

It is understood that in some embodiments, the projecting of the incident light and the corresponding optical measurement of the $I_{+1}$ and $I_{-1}$ diffracted light may be performed collectively and simultaneously for all the asymmetric features in the structure 200. In other embodiments, the projecting of the incident light and the corresponding optical measurement of the $I_{+1}$ and $I_{-1}$ diffracted light may be performed individually for each of the asymmetric features in the structure 200. In any case, based on the collected $I_{+1}$ and $I_{-1}$ data, asymmetry and mean intensity information with respect to focus and dose of the exposure process can be defined as follows:

$$\text{Asymmetry} = I_{+1} - I_{-1} \quad \text{Mean Intensity} = \frac{I_{+1} + I_{-1}}{2}$$

It is understood that in various embodiments, the light intensities (or their sum or difference) discussed herein may be normalized by a reference light intensity. The reference light intensity may be the incident light intensity, or a total reflected light intensity, or a part of an averaged light intensity. In any case, the measured asymmetry and mean intensity data is sent to a computer 280 that contains one or more electronic processors. The one or more electronic processors analyze the measured asymmetry and mean intensity data to establish a model that may be used to predict or estimate the focus and dose in an exposure process, as discussed in more detail below.

Figure 6:
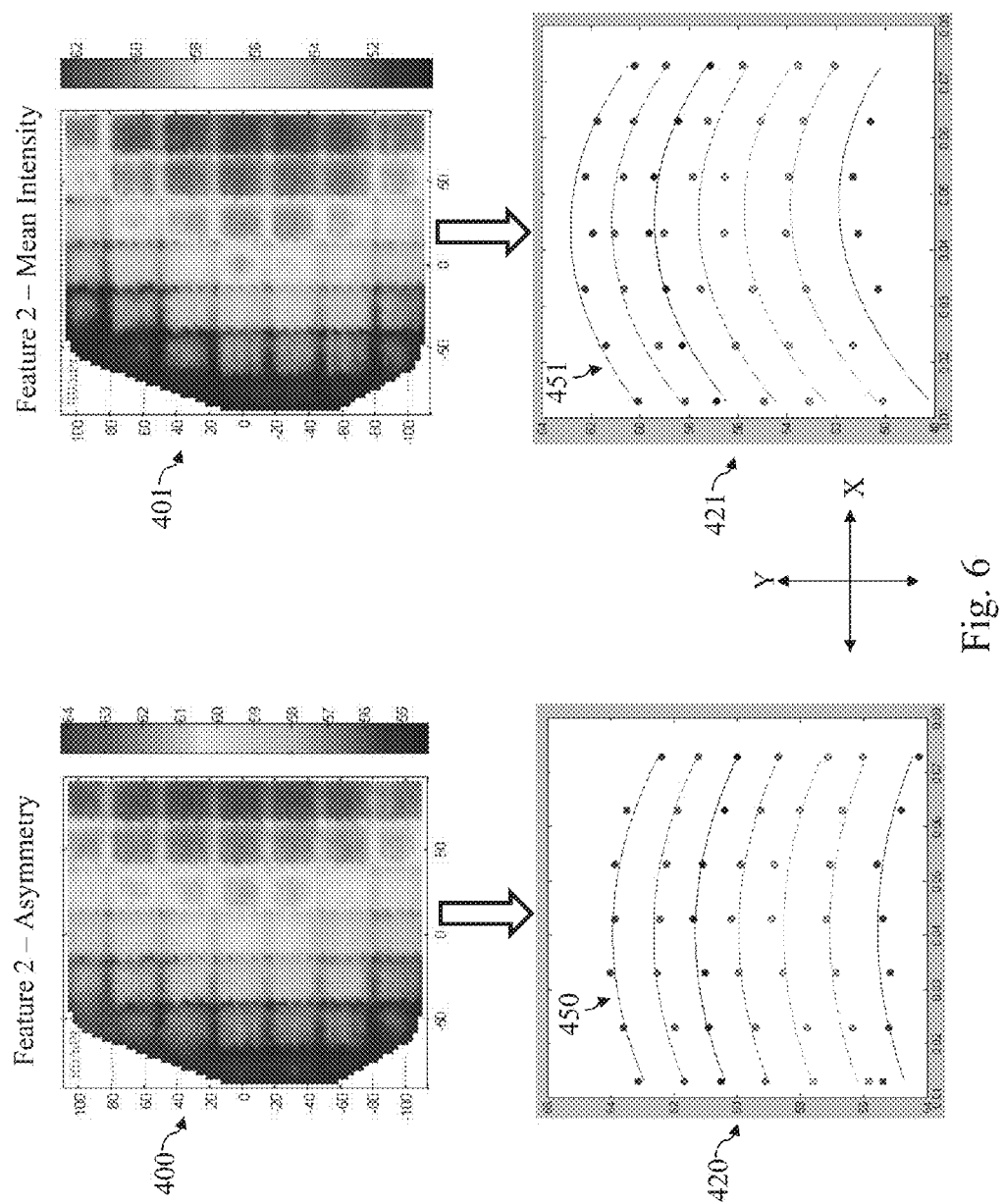

The manner in which the model is established is graphically illustrated in FIGS. 5-6. In FIG. 5, an image 300 graphically illustrates, on a wafer, the asymmetry data ($I_{+1} - I_{-1}$) measured by the optical measurement tool 250 for a first asymmetric feature (e.g., denoted as "feature 1" in FIG. 5) of the structure 200. An image 301 graphically illustrates, on the same wafer, the mean intensity data ($I_{+1} + I_{-1}$)/2 measured by the optical measurement tool 250 for the first asymmetric feature of the structure 200.

The wafer illustrated in FIG. 5 includes a plurality of fields (e.g., more than 50 or 60 fields). Each field contains a plurality of instances of the structure 200 (e.g., about 30 to 60 instances of the structures per field). Each instance (or copy) of the structure 200 is substantially the same as the other instances in the same field of the structure 200. For reasons of simplicity, the instances of the structure 200 may simply be referred to as the structure 200 hereinafter.

The fields are formed with a spread of different focus and dose conditions. In other words, the structures 200 in different fields are formed with different focus and/or dose conditions. For example, the structures 200 in a field 1 may be formed with an $F_1$ focus and an $E_1$ dose, and the structures 200 in a field 2 may be formed with an $F_2$ focus and an $E_2$ dose, and the structures 200 in a field 3 may be formed with an $F_3$ focus and an $E_3$ dose, etc., where $F_1 \neq F_2 \neq F_3$, and $E_1 \neq E_2 \neq E_3$. As such, the wafer associated with FIG. 5 (and with FIG. 6 discussed below) may be referred to as a spread wafer. It is understood that the images 300-301 may correspond to a partial illustration of the spread wafer and may not show all the fields of the spread wafer.

Due to the different conditions (i.e., dose and focus) of the exposure process used to form the structures 200 in the different fields, the structures 200 in one field may have physical variations from the structures 200 in a different field. These physical variations may be manifested in terms of the asymmetry and mean intensity discussed above. For example, in FIG. 5, the colors of the fields in the images 300-301 correspond to the amount of asymmetry and mean intensity, respectively. The warmer the color (i.e., closer to red), the greater the asymmetry and mean intensity. The cooler the color (i.e., closer to blue), the less the asymmetry and mean intensity. As FIG. 5 illustrates, different fields on the wafer have different asymmetry and mean intensity values.

The asymmetry and mean intensity information contained in the images 300 and 301 may also be translated into graphs 320 and 321 shown in FIG. 5, respectively. For the graph 320, the X-axis represents the focus of the exposure process used to form the feature 1 of the structures 200 on the spread wafer, and the Y-axis represents the measured asymmetry of feature 1 of the structures 200 on the spread wafer. For the graph 321, the X-axis represents the focus of the exposure process used to form the feature 1 of the structures 200 on the spread wafer, and the Y-axis represents the measured mean intensity of feature 1 of the structures 200 on the spread wafer. The various curves or plots 350 and 351 in the graphs 320 and 321 correspond to different doses of the exposure process used to form the feature 1.

Similarly, FIG. 6 contains images 400 and 401 that graphically illustrate, on the same spread wafer containing plurality of fields with different exposure spreads (i.e., different doses and/or focus), the asymmetry data ($I_{+1}-I_{-1}$) and mean intensity data ($I_{+1}+I_{-1}$)/2 measured by the optical measurement tool 250 for a second asymmetric feature (e.g., denoted as "feature 2" in FIG. 6) of the structure 200. The features 1 and 2 correspond to two of the different features in the structure 200. The asymmetry and mean intensity information contained in the images 400 and 401 may also be translated into graphs 420 and 421 shown in FIG. 6, respectively. Again, the X-axis represents the focus of the exposure process used to form the feature 2 of the structures 200 on the spread wafer, the Y-axis of the graph 420 represents the measured asymmetry of feature 2 of the structures 200 on the spread wafer, and the Y-axis of the graph 421 represents the measured mean intensity of feature 2 of the structures 200 on the spread wafer. The various curves or plots 450 and 451 in the graphs 420 and 421 correspond to different doses of the exposure process used to form the feature 1.

Based on the graphs 320-321 and 420-421, the following mathematical equation or model may be established:

$$\text{Asymmetry or MeanIntensity or } I_{+1} \text{ or } I_{-1} = \Sigma\Sigma a_{ij}(E-E_0)^i \cdot (F-F_0)^j$$

In the above equation, E represents the actual dose of the exposure process, F represents the actual focus of the exposure process, $E_0$ represents the target dose of the exposure process, $F_0$ represents the target focus of the exposure process, and $a_{ij}$ represents the model parameters of the focus and dose polynomial terms. Using the data contained in the graphs 320-321 and 420-421, $a_{ij}$ can be calculated, for example by solving for two variables with two equations. $A_{ij}$ helps describe the mathematical relationship between the asymmetry and mean intensity data of a structure (containing multiple asymmetric features) and the focus and dose of the exposure process used to form the structure. In other words, given the measured data for the asymmetry and mean intensity data of the asymmetry features of a structure, the actual focus and dose information of the exposure process used to form such structure can be predicted or estimated. This is graphically illustrated in FIG. 7.

Figure 7:
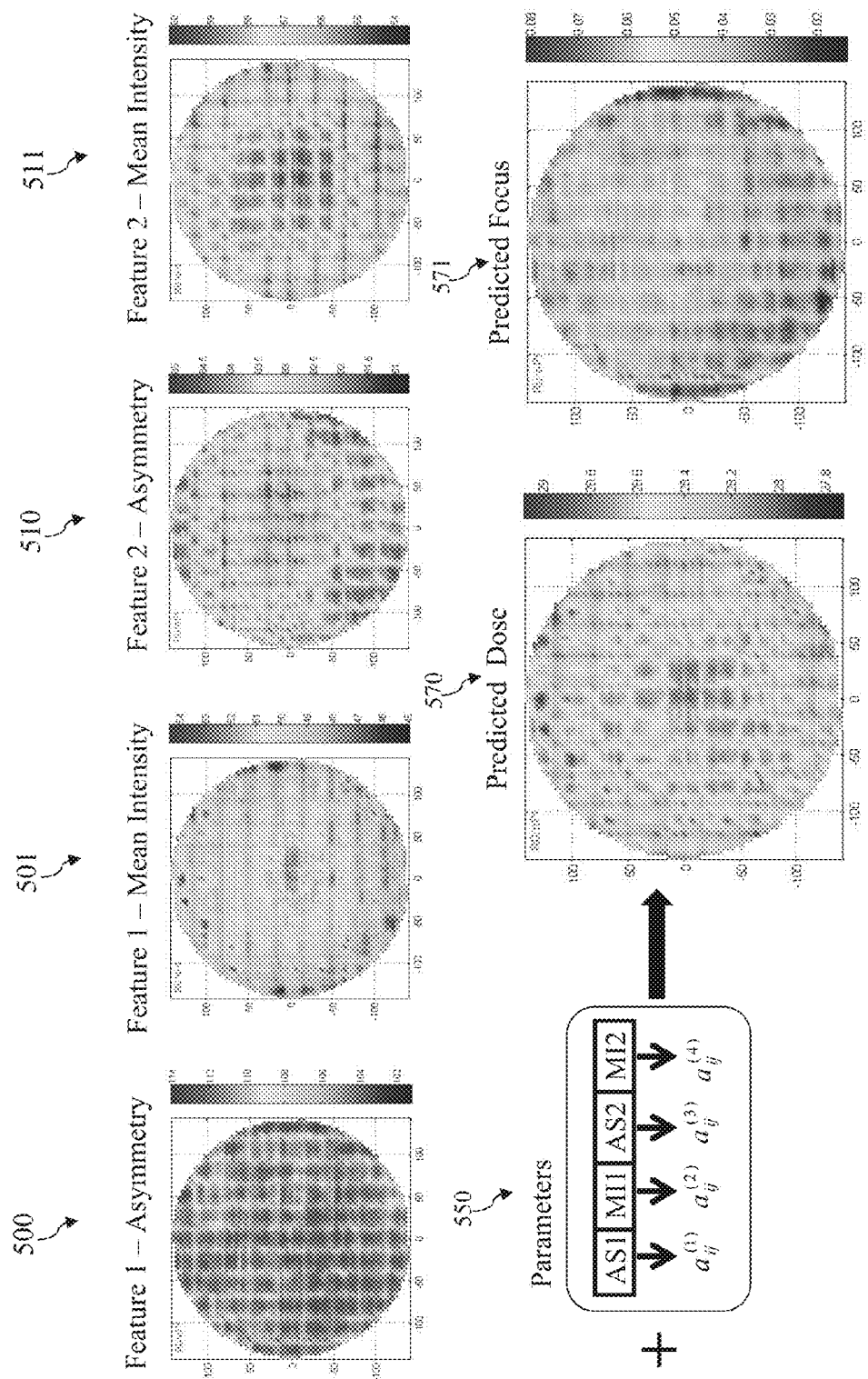
FIG. 7 provides a graphical illustration of a process for generating an estimate for a dose and a focus used in an exposure process based on asymmetry and mean intensity data measured from periodic asymmetric features in accordance with some embodiments of the present disclosure.

With respect to FIG. 7, the various images illustrated therein pertain to a regular production wafer, hereinafter referred to as a production wafer. The production wafer may also include a plurality of fields, which may each contain one or more instances of the structure 200 discussed above. However, unlike the spread wafer discussed above in association with FIGS. 5-6, the fields in the production wafer are not formed (at least not intentionally) with the different dose and/or focus as in the spread wafer. In other words, the fields of the production wafer are intended to be formed with more uniformity. For example, the target dose may be $E_0$, and the target focus may be $F_0$. However, the actual dose and focus of the exposure process may not be readily known and may deviate or drift away from the target dose $E_0$ and target focus $F_0$. The drift or deviation of the actual dose and focus from their target values may lead to manufacturing problems such as decreased yield or substandard device performance.

According to the various aspects of the present disclosure, the model discussed above allows for the actual dose and focus values of the exposure process to be predicted "after the fact". For example, images 500-501 correspond to the asymmetry and mean intensity data of feature 1 throughout the production wafer, and images 510-511 correspond to the asymmetry and mean intensity data of feature 2 throughout the production wafer. In other words, for each feature 1 or feature 2 on the production wafer, its asymmetry value and mean intensity value can be extracted. Also as discussed above, the polynomial $a_{ij}$ has already been determined as a part of the model. Thus, in a step 550, the asymmetry and mean intensity values for features 1 and 2 (AS1=asymmetry of feature 1, MI1=mean intensity of feature 1, AS2=asymmetry of feature 2, MI2=mean intensity of feature 2) are plugged into the model (or equation) discussed above, and the actual dose (E) and focus (F) can be solved. In other words, the model allows for the actual dose and focus data of an exposure process to be predicted, after the exposure process has already been performed. The predicted dose and focus information throughout the production wafer is graphically illustrated in images 570 and 571, respectively.

Being able to accurately predict the actual dose and focus information is beneficial. For example, it allows for better monitoring of the exposure process. The actual values of the dose and focus may be compared with the target dose and focus values, and deviations of the actual values from the target values may be detected. If the deviation is beyond an acceptable level, then the lithography equipment may be pulled offline for maintenance. Alternatively, the lithography equipment settings may be adjusted to account for (or compensate) the deviation for subsequent production wafers.

The model established herein can also be used as a quality index. In more detail, a model fitting error can be determined using the measurement data for focus and dose. For example, once a trusted model (describing the relationship between focus/dose and asymmetry/mean intensity) has been established, "new models" can be generated by a particular set of measured focus/dose data. The "new model" can be compared with the trusted model to see how well the new model fits. If the two models match relatively well (i.e., model fitting error is low), then the quality index is high, meaning that the measurements of dose and focus can be trusted with a high confidence level. On the other hand, if the new model does not fit the trusted model (i.e., model fitting error is high), then the quality index is low, and the measurements of dose and focus cannot be trusted.

Figure 8:
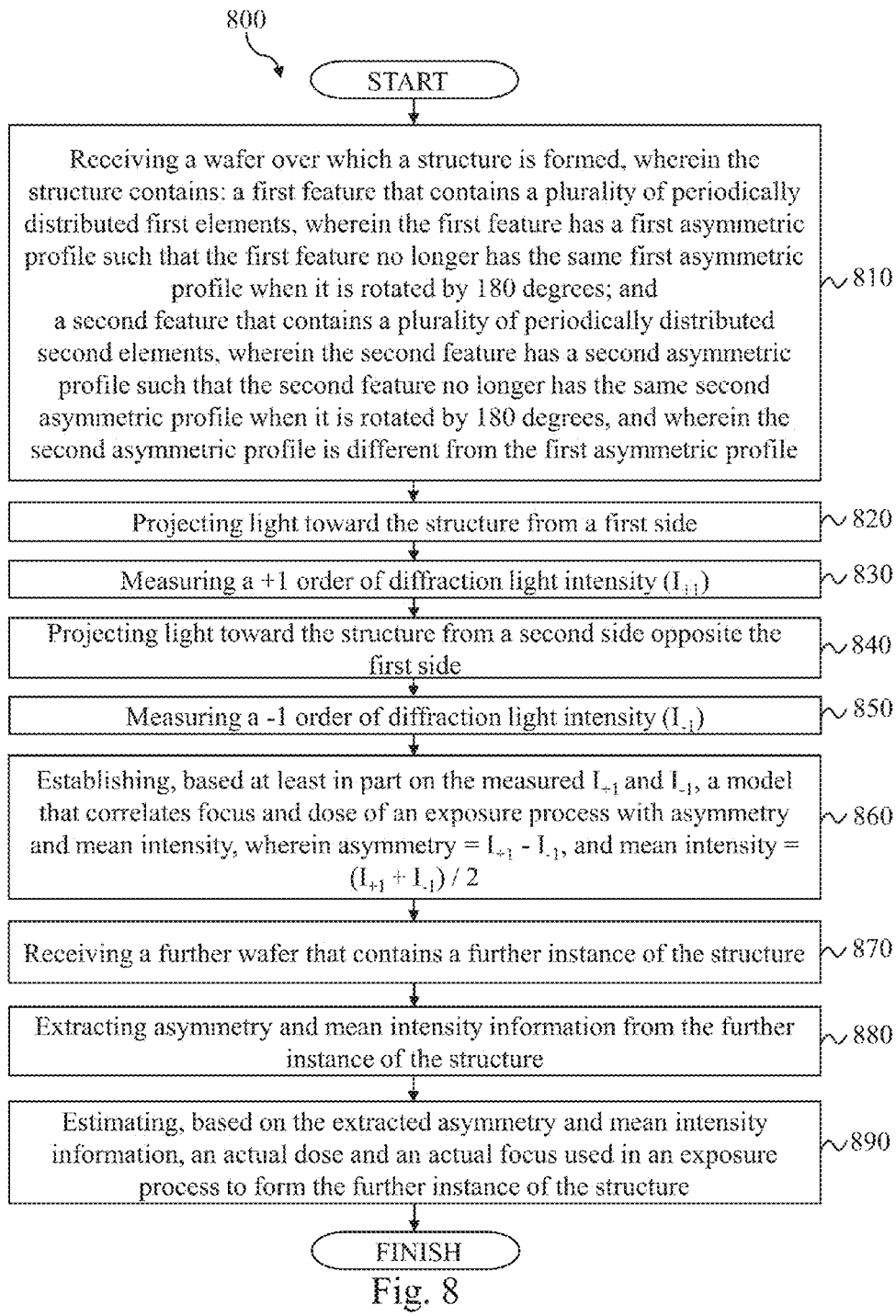
FIG. 8 is a flowchart illustrating a method of generating an estimate for a dose and a focus used in an exposure process based on asymmetry and mean intensity data measured from periodic asymmetric features in accordance with some embodiments of the present disclosure.

FIG. 8 is a flowchart of a method 800 of generating an estimate for a dose and a focus used in an exposure process based on asymmetry and mean intensity data measured from periodic asymmetric features in accordance with some embodiments of the present disclosure.

The method 800 includes a step 810 of receiving a wafer over which a structure is formed. The structure contains at least a first feature and a second feature. The first feature contains a plurality of periodically distributed first elements. The first feature has a first asymmetric profile such that the first feature no longer has the same first asymmetric profile when it is rotated by 180 degrees. The second feature contains a plurality of periodically distributed second elements. The second feature has a second asymmetric profile such that the second feature no longer has the same second asymmetric profile when it is rotated by 180 degrees. The second asymmetric profile is different from the first asymmetric profile. In some embodiments, none of the first and second elements are sub-resolution assist features.

In some embodiments, the wafer includes a plurality of fields that each contain one or more instances of the structure. The structures in different fields are formed with different focus or different dose in an exposure process, thereby causing the instances of the structures in each field to have physical variations from the instances of the structures in other fields. In some embodiments, the structure includes a patterned photoresist material.

The method 800 includes a step 820 of projecting light toward the structure from a first side, for example from a left side.

The method 800 includes a step 830 of measuring a +1 order of diffraction light intensity ($I_{+1}$) in response to the light projected toward the structure according to step 820.

The method 800 includes a step 840 of projecting light toward the structure from a second side opposite the first side, for example from a right side.

The method 800 includes a step 850 of measuring a −1 order of diffraction light intensity ($I_{-1}$) in response to the light projected toward the structure according to step 840.

The method 800 includes a step 860 of establishing, based at least in part on the measured $I_{+1}$ and $I_{-1}$ in steps 830 and 850, a model that correlates focus and dose of an exposure process with asymmetry and mean intensity, wherein asymmetry=$I_{+1}-I_{-1}$, and mean intensity=$(I_{+1}+I_{-1})/2$.

The method 800 includes a step 870 of receiving a further wafer that contains a further instance of the structure.

The method 800 includes a step 880 of extracting asymmetry and mean intensity information from the further instance of the structure.

The method 800 includes a step 890 of estimating, based on the extracted asymmetry and mean intensity information, an actual dose and an actual focus used in an exposure process to form the further instance of the structure.

In some embodiments, the first feature is periodically distributed with respect to a first axis, and the first side and the second side span along the first axis. The steps 820-850 are performed with respect to the first feature. In embodiments where the second feature is also periodically distributed with respect to the first axis, the method 800 further comprises repeating, for the second feature, the steps 820-850. In embodiments where the second feature is periodically distributed with respect to a second axis different from the first axis, the method 800 further comprises repeating, for the second feature, the steps 820-850, except that the light is projected from opposite third and fourth sides that span along the second axis. In any case, the step 890 of establishing the model is performed based on the asymmetry and mean intensity associated with first feature and the asymmetry and mean intensity associated with the second feature.

It is understood that additional processes may be performed before, during, or after the steps 810-890 of the method 800. For example, the method 800 may include a step of monitoring a deviation of the estimated actual dose and actual focus from a target dose and a target focus, and an additional step of performing maintenance on a lithography equipment used to perform the exposure process. For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that by using two more periodic asymmetric features in a structure to establish the model discussed above, both focus and dose can be accurately predicted. In comparison, previous methods may only be able to estimate focus, but not dose, or at least not very well due to cross-talk. Another advantage is that the asymmetric features in the structure discussed herein do not require sub-resolution assist features, unlike in certain conventional methods. This relaxes fabrication requirements. The asymmetric features can also have flexible designs, unlike certain conventional methods. In addition, the structure (containing the asymmetric features) discussed above does not require any specific underlayer materials or arrangements. Another advantage is that by accurately estimating the actual dose and focus used in an exposure process during production, the exposure process parameters (e.g., focus and dose) can be monitored, and actions may be taken to correct any unacceptable deviation of actual dose or focus values from target dose or focus values. For example, when the deviation becomes excessive, the exposure equipment may be pulled offline for maintenance. Alternatively, the equipment may be adjusted to compensate for the deviation. Another advantage is that the model discussed above can be used as a quality index by determining the model fitting error. The quality index will indicate how well the measurements can be trusted.

One embodiment of the present disclosure pertains to a structure in semiconductor fabrication. The structure includes a first feature that contains a plurality of periodically distributed first elements. The first feature has a first asymmetric profile such that the first feature no longer has the same first asymmetric profile when it is rotated by 180 degrees. The structure also includes a second feature that contains a plurality of periodically distributed second elements. The second feature has a second asymmetric profile such that the second feature no longer has the same second asymmetric profile when it is rotated by 180 degrees. The second asymmetric profile is different from the first asymmetric profile.

Another embodiment of the present disclosure pertains to a method of generating an estimate for a dose and a focus used in an exposure process based on asymmetry and mean intensity data measured from periodic asymmetric features. A wafer is received. A structure disposed over the wafer contains a first feature and a second feature. The first feature contains a plurality of periodically distributed first elements. The first feature has a first asymmetric profile such that the first feature no longer has the same first asymmetric profile when it is rotated by 180 degrees. The second feature contains a plurality of periodically distributed second elements. The second feature has a second asymmetric profile such that the second feature no longer has the same second asymmetric profile when it is rotated by 180 degrees. The second asymmetric profile is different from the first asymmetric profile. A first incident light is projected toward the structure from a first side. Thereafter, a +1 order of diffraction light intensity ($I_{+1}$) is measured in response to the projection of the first incident light. A second incident light is projected toward the structure from a second side opposite the first side. Thereafter, a −1 order of diffraction light intensity ($I_{-1}$) is measured in response to the projection of the second incident light. Thereafter, based at least in part on the measured $I_{+1}$ and $I_{-1}$, a model is established. The model correlates focus and dose of an exposure process with asymmetry and mean intensity, wherein asymmetry=$I_{+1}-I_{-1}$, and mean intensity=$(I_{+1}+I_{-1})/2$.

Yet another embodiment of the present disclosure pertains to a semiconductor fabrication system. The semiconductor fabrication system includes a wafer over which a photoresist structure is formed. The photoresist structure contains a first feature and a second feature. The first feature contains a plurality of periodically distributed first elements. The first feature has a first asymmetric profile such that the first feature no longer has the same first asymmetric profile when it is rotated by 180 degrees. The second feature contains a plurality of periodically distributed second elements. The second feature has a second asymmetric profile such that the second feature no longer has the same second asymmetric profile when it is rotated by 180 degrees. The second asymmetric profile is different from the first asymmetric profile. The semiconductor fabrication system includes an optical measurement tool that is configured to measure a +1 order of diffraction light intensity ($I_{+1}$) in response to a first incident light projected toward the photoresist structure from the first side, as well as measure a −1 order of diffraction light intensity ($I_{-1}$) in response to a second incident light projected toward the photoresist structure from the second side. The semiconductor fabrication system also includes one or more electronic processors configured to establish, based at least in part on the measured $I_{+1}$ and $I_{-1}$, a model that correlates focus and dose of an exposure process with asymmetry and mean intensity, wherein asymmetry= $I_{+1}-I_{-1}$, and mean intensity=$(I_{+1}+I_{-1})/2$.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A structure in semiconductor fabrication, comprising:
a first feature that contains a plurality of periodically distributed first elements, wherein the first feature has a first asymmetric profile such that the first feature no longer has the same first asymmetric profile when it is rotated by 180 degrees;
a second feature that contains a plurality of periodically distributed second elements, wherein the second feature has a second asymmetric profile such that the second feature no longer has the same second asymmetric profile when it is rotated by 180 degrees, and wherein the second asymmetric profile is different from the first asymmetric profile; and
a third feature that contains a plurality of periodically distributed third elements, wherein the third feature has a third asymmetric profile such that the third feature no longer has the same third asymmetric profile when it is rotated by 180 degrees, and wherein the third asymmetric profile is different from the first asymmetric profile and the second asymmetric profile;
wherein the first feature, the second feature, and the third feature have different top view profiles regardless of how each of the first, second, and third features is rotated in a top view.

2. The structure of claim 1, wherein the structure is a part of a lithography photomask.

3. The structure of claim 1, wherein the structure is a part of a photoresist pattern on a wafer.

4. The structure of claim 1, wherein none of the first and second elements are sub-resolution assist features.

5. The structure of claim 1, wherein within the structure, the first feature is periodically distributed with respect to a first axis, and the second feature is periodically distributed with respect to a second axis different from the first axis.

6. The structure of claim 1, wherein:
the first feature is located in a first corner of the structure;
the second feature is located in a second corner of the structure; and
the third feature is located in a third corner of the structure.

7. A method, comprising:
receiving a wafer over which a structure is formed, wherein the structure contains:
a first feature that contains a plurality of periodically distributed first elements, wherein the first feature has a first asymmetric profile in a top view such that the first feature no longer has the same first asymmetric profile when it is rotated by 180 degrees; and
a second feature that contains a plurality of periodically distributed second elements, wherein the second feature has a second asymmetric profile in the top view such that the second feature no longer has the same second asymmetric profile when it is rotated by 180 degrees, and wherein the second asymmetric profile is different from the first asymmetric profile;
a third feature that contains a plurality of periodically distributed third elements, wherein the third feature has a third asymmetric profile in the top view such that the third feature no longer has the same third asymmetric profile when it is rotated by 180 degrees, and wherein the third asymmetric profile is different from the first asymmetric profile and the second asymmetric profile regardless of how each of the first, second, and third features is rotated in the top view;
projecting a first incident light toward the structure from a first side, wherein at least a +1 order of diffraction light is produced in response to the projected first incident light;
measuring an intensity of the +1 order of diffraction light ($I_{+1}$);
projecting a second incident light toward the structure from a second side opposite the first side, wherein at least a −1 order of diffraction light is produced in response to the projected second incident light;
measuring an intensity of the −1 order of diffraction light ($I_{-1}$); and
establishing, based at least in part on the measured $I_{+1}$ and $I_{-1}$, a model that correlates focus and dose of an exposure process with asymmetry and mean intensity, wherein asymmetry=$I_{+1}-I_{-1}$, and mean intensity=$(I_{+1}+I_{-1})/2$.

8. The method of claim 7, wherein:
the wafer includes a plurality of fields that each contain one or more instances of the structure; and
the instances of the structure in different fields are formed with different focus or different dose in an exposure process, thereby causing the instances of the structure in each field to have physical variations from the instances of the structure in other fields.

9. The method of claim 7, further comprising:
receiving a further wafer that contains a further instance of the structure;
extracting asymmetry and mean intensity information from the further instance of the structure; and
estimating, based on the extracted asymmetry and mean intensity information, an actual dose and an actual focus used in an exposure process to form the further instance of the structure.

10. The method of claim 9, further comprising:
monitoring a deviation of the estimated actual dose and actual focus from a target dose and a target focus; and
performing maintenance on a lithography equipment used to perform the exposure process.

11. The method of claim 7, wherein the structure includes a patterned photoresist material.

12. The method of claim 7, wherein none of the first and second elements are sub-resolution assist features.

13. The method of claim 7, wherein the first feature is periodically distributed with respect to a first axis, wherein the first side and the second side span along the first axis, and wherein the projecting the light from the first side, the measuring the $I_{+1}$, the projecting the light from the second side, and the measuring the $I_{-1}$ are performed with respect to the first feature.

14. The method of claim 13, wherein the second feature is periodically distributed with respect to the first axis, and wherein the method further comprises: repeating, for the second feature, the projecting the light from the first side, the measuring the $I_{+1}$, the projecting the light from the second side, and the measuring the $I_{-1}$, and wherein the establishing of the model is performed based on the asymmetry and mean intensity associated with first feature and the asymmetry and mean intensity associated with the second feature.

15. The method of claim 13, wherein the second feature is periodically distributed with respect to a second axis different from the first axis, and wherein the method further comprises: repeating, for the second feature, the projecting the light from a third side, the measuring the $I_{+1}$, the projecting the light from a fourth side opposite the third side, and the measuring the $I_{-1}$, wherein the third side and the fourth side span along the second axis, and wherein the establishing of the model is performed based on the asymmetry and mean intensity associated with the first feature and the asymmetry and mean intensity associated with the second feature.

16. The method of claim 7, wherein:
the projecting of the first incident light comprise projecting the first incident light at a first angle;
the projecting of the second incident light comprise projecting the second incident light at a second angle; and
the first angle and the second angle are each between 5 degrees and 85 degrees.

17. A semiconductor fabrication system, comprising:
a wafer over which a photoresist structure is formed, wherein the photoresist structure contains:
a first feature that contains a plurality of periodically distributed first elements, wherein the first feature has a first asymmetric profile in a top view such that the first feature no longer has the same first asymmetric profile when it is rotated by 180 degrees;
a second feature that contains a plurality of periodically distributed second elements, wherein the second feature has a second asymmetric profile in the top view such that the second feature no longer has the same second asymmetric profile when it is rotated by 180 degrees, and wherein the second asymmetric profile is different from the first asymmetric profile; and
a third feature that contains a plurality of periodically distributed third elements, wherein the third feature has a third asymmetric profile in the top view such that the third feature no longer has the same third asymmetric profile when it is rotated by 180 degrees, and wherein the third asymmetric profile is different from the first asymmetric profile and the second asymmetric profile regardless of how each of the first, second, and third features is rotated in the top view;
an optical measurement tool that is configured to:
measure a +1 order of diffraction light intensity ($I_{+1}$), wherein the +1 order of diffraction light is generated in response to a first incident light being projected toward the photoresist structure from a first side of the photoresist structure; and
measure a −1 order of diffraction light intensity ($I_{-1}$), wherein the −1 order of diffraction light is generated in response to a second incident light being projected toward the photoresist structure from a second side that is opposite the first side; and
one or more electronic processors configured to establish, based at least in part on the measured $I_{+1}$ and $I_{-1}$, a model that correlates focus and dose of an exposure process with asymmetry and mean intensity, wherein asymmetry=$I_{+1}-I_{-1}$, and mean intensity=$(I_{+1}+I_{-1})/2$.

18. The semiconductor fabrication system of claim 17, wherein none of the first and second elements are sub-resolution assist features.

19. The semiconductor fabrication system of claim 17, wherein within the photoresist structure, the first feature is periodically distributed with respect to a first axis, and the second feature is periodically distributed with respect to a second axis different from the first axis.

20. The semiconductor fabrication system of claim 17, wherein the optical measurement tool includes a scatterometry machine or a diffractometry machine.

* * * * *